United States Patent [19]
Callahan

[11] Patent Number: 5,898,641
[45] Date of Patent: Apr. 27, 1999

[54] ADDRESS TRANSITION CIRCUIT FOR A MEMORY

[75] Inventor: John M. Callahan, San Ramon, Calif.

[73] Assignee: Enable Semiconductor, Inc., Milpitas, Calif.

[21] Appl. No.: 09/012,042

[22] Filed: Jan. 22, 1998

[51] Int. Cl.$^6$ ........................................... G11C 7/00
[52] U.S. Cl. ..................... 365/223.5; 365/189.05
[58] Field of Search .................. 365/233.5, 194, 365/189.05; 326/93; 327/175, 176

[56] References Cited

U.S. PATENT DOCUMENTS 5,706,246  1/1998  Choi et al. ........................... 365/233.5
5,708,625  1/1998  Sato et al. ............................ 365/233.5

*Primary Examiner*—Vu A. Le
*Attorney, Agent, or Firm*—Patrick T. King

[57] ABSTRACT

A resettable latch circuit provides a modified address transition detection (XATD) signal in response to receiving an address-change input pulse signal at a SET input terminal thereof. A RESET input terminal for the latch circuit receives a delayed reset signal from a resettable delay circuit which has its input terminal coupled to the output terminal of the resettable latch circuit to receive the XATD signal. The resettable delay circuit includes a reset control signal terminal to which is coupled an inverted address-change input pulse. One embodiment of the resettable delay circuit includes a series of inverters and MOSFET load resistors as well as shunt MOSFET transistors turned on by the address-change signal to shunt the output terminals of the inverters and reset the delay line. The SET input terminal of the latch circuit also receives a chip-select-change signal pulse which is similar to the address-change pulse.

4 Claims, 5 Drawing Sheets

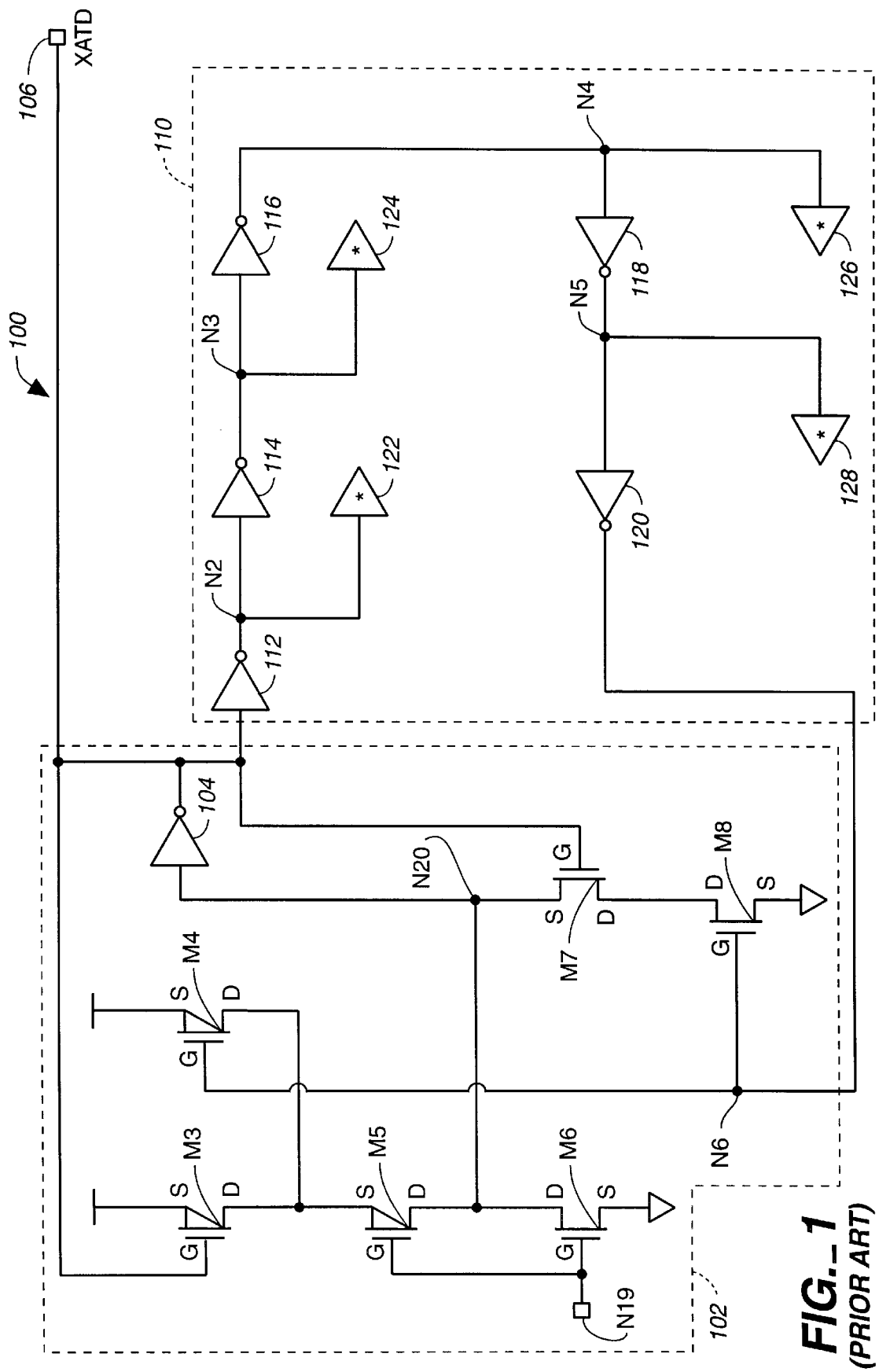
FIG._1 (PRIOR ART)

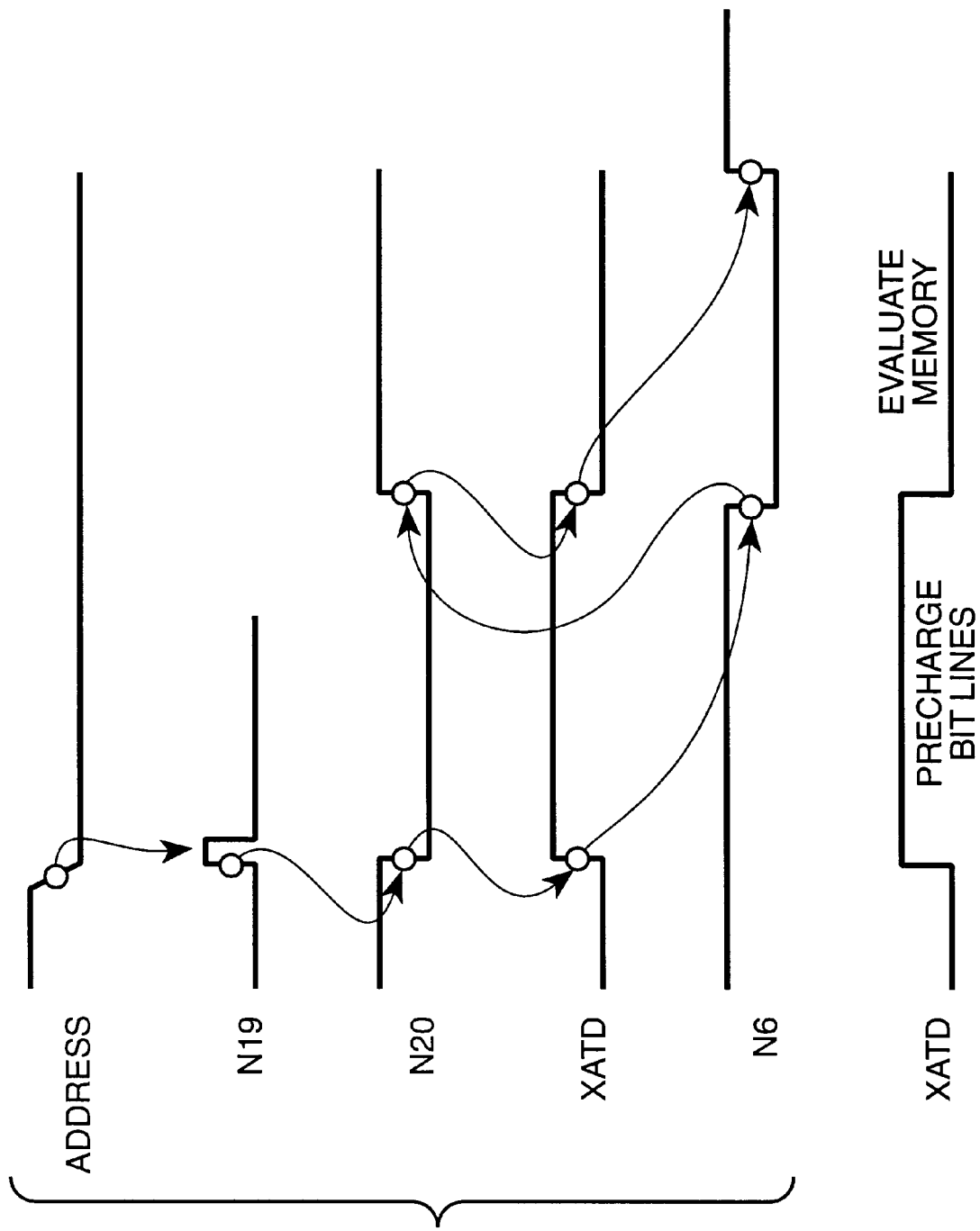

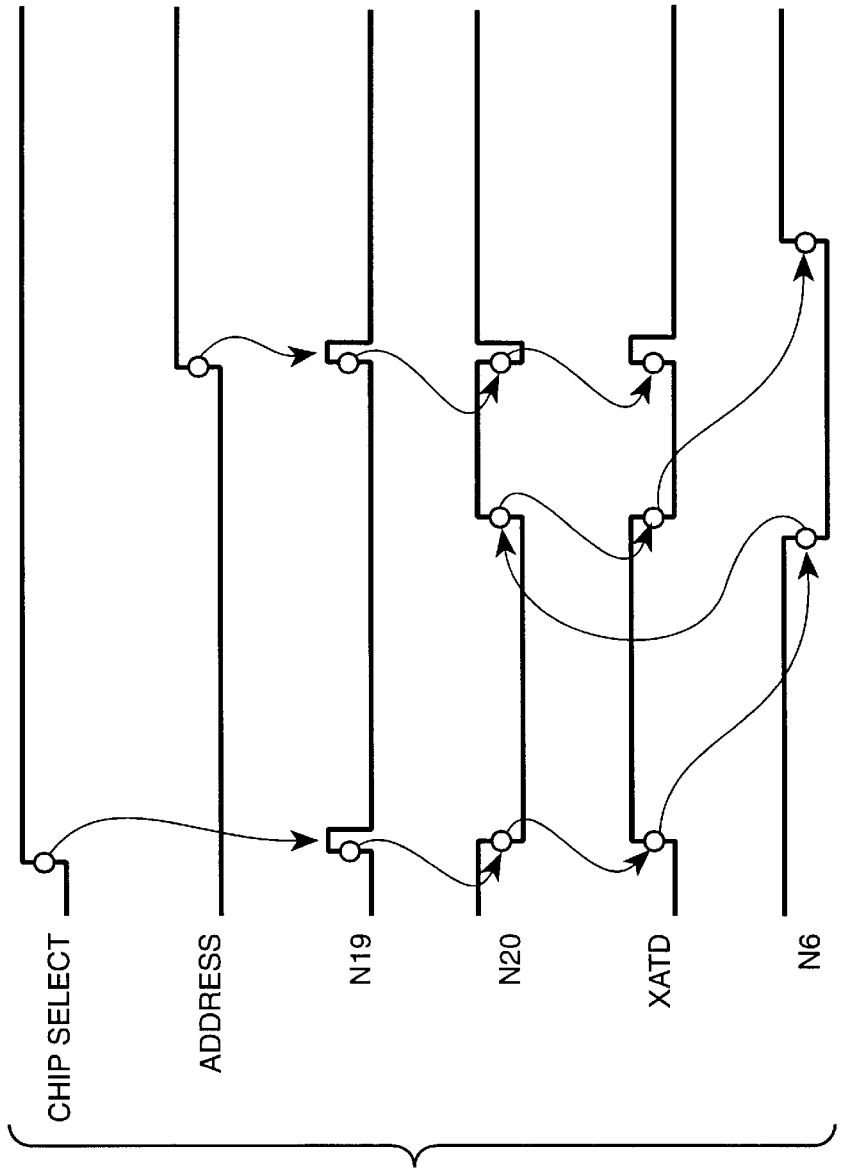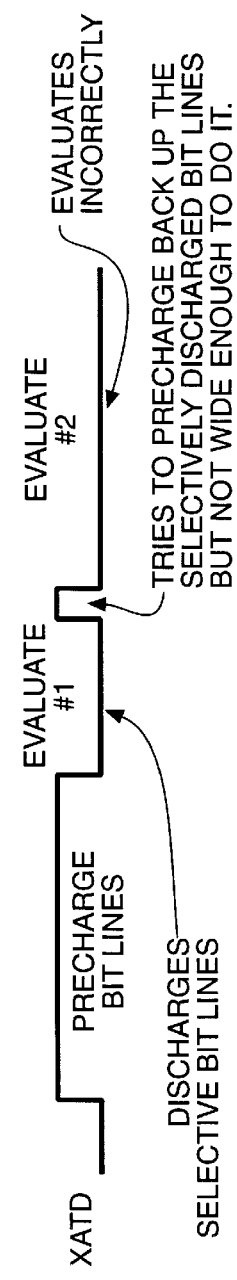
FIG._3A
FIG._3B

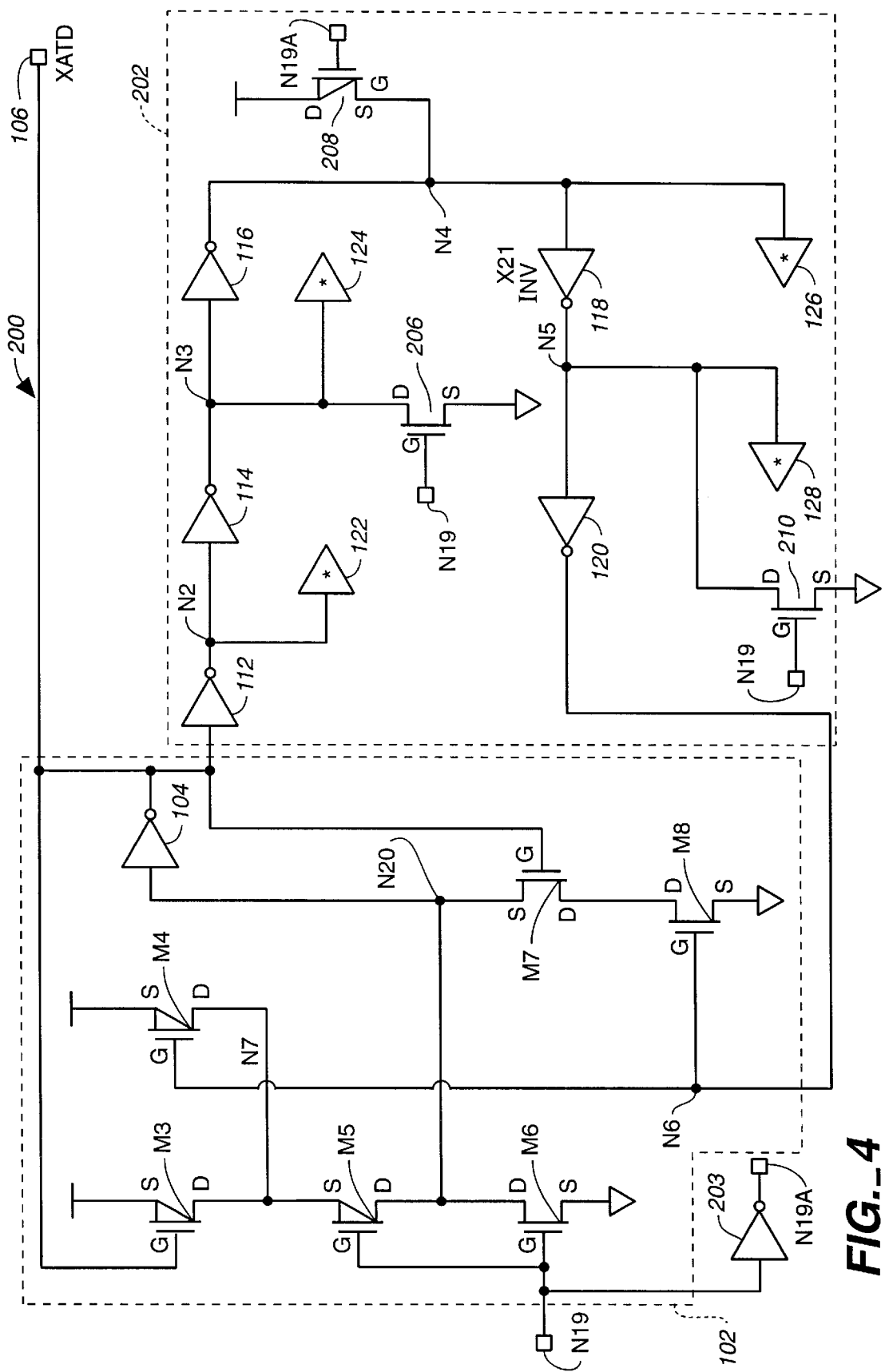
FIG._4

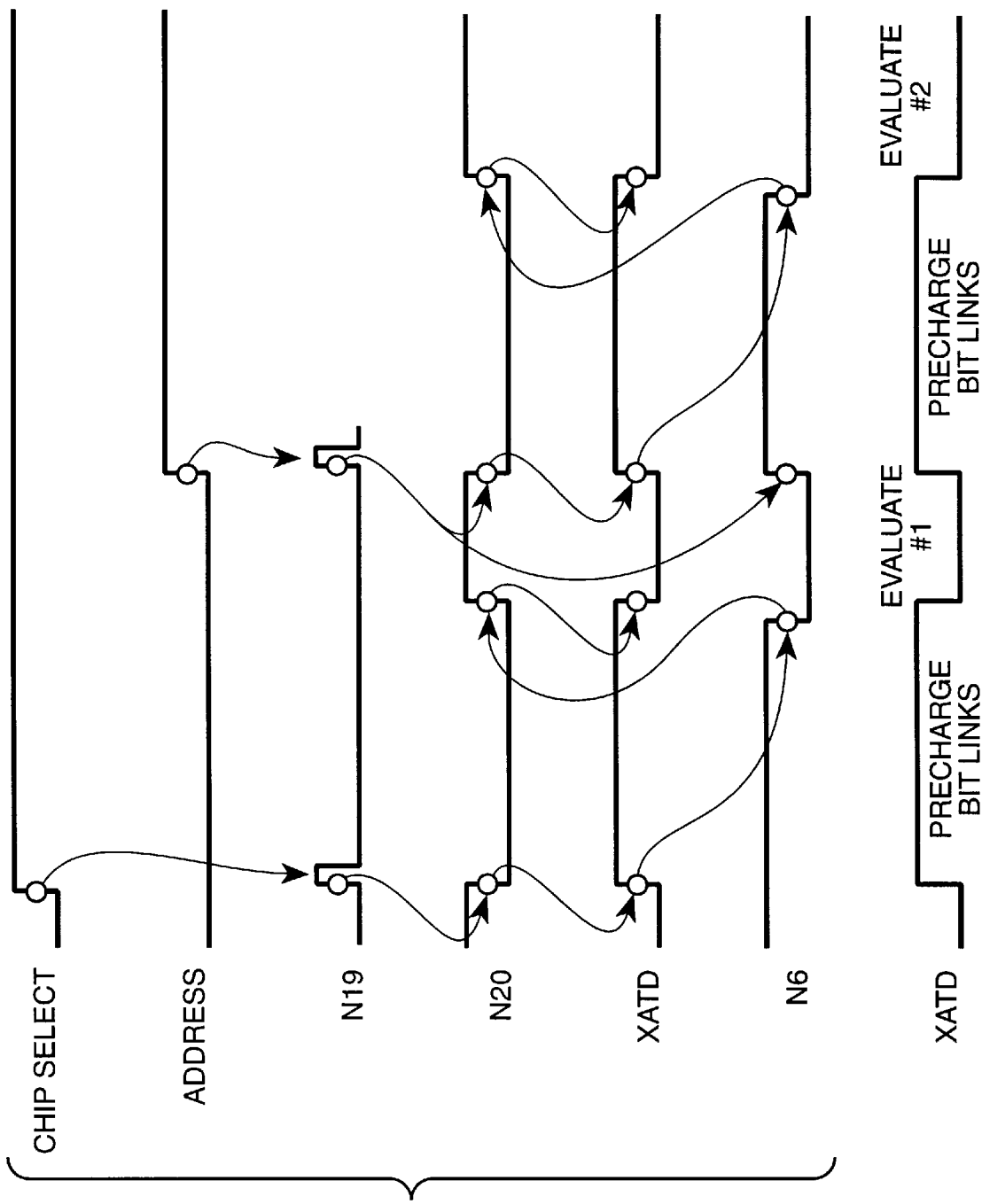
FIG._5A
FIG._5B

ADDRESS TRANSITION CIRCUIT FOR A MEMORY

BACKGROUND OF THE INVENTION

1. Field of the Invention

This invention relates memory control circuits and, more particularly, to an improved address transition circuit for a memory device.

2. Prior Art

Previously, random access memories (RAMs) were purely static devices, that is, clocking techniques were not used with static RAMs. When address signals were applied to such devices, the address signals just rippled through to the memory cells to retrieve data stored therein. These devices were simple in operation, but slow and consumed large amounts of power.

Next, an address transition detection (ATD) technique was used which simulated static operation externally while clocking techniques were used inside the memory circuit to save power, chip area, and to speed up operation.

With reference to FIGS. 1 and 2, an ATD circuit 100 is shown In FIG. 1 and timing diagrams are shown in FIG. 2. An address-change input pulse is provided at node N19. This address-change input pulse is produced when a memory address bit signal changes. The memory address bit signal is sent through a delay line (not shown). The memory address bit and a delayed memory address bit from the delay line are then both inputted to an Exclusive-OR (XOR) circuit. The XOR circuit produces the address-change input pulse at node N19 which has a pulse width equal to the delay time of the delay line.

FIG. 2 is a timing chart timing showing an address bit signal changing levels and a resultant address-change input pulse at node N19. The address-change input pulse is applied to an input terminal of a resettable latch circuit 102 having a SET input terminal connected to node N19, a RESET input terminal connected to a node N6, and an OUTPUT terminal at a node N20. A latch output signal is provided at node N20 and inverted with an inverter 104 to provide a modified ATD signal called XATD at an output terminal 106. The XATD signal at terminal 106 is also directed to a delay circuit 110 to provide a delayed reset signal at the reset node N6 of the resettable latch circuit 102. The address-change input pulse at node N19 sets the XATD signal and the reset signal at node N6 resets the XATD signal. The XATD signal passes through the delay line 110 to put the signal at node N6 back to its initial condition as a logic one as shown in FIG. 2.

One embodiment of the latch circuit 102 includes three PMOS transistors M3, M4, M5 and four NMOS transistors M5, M6, M7, M8 connected as illustrated in FIG. 1.

The delay circuit 110 provides a delayed reset signal at the reset node N6 of the resettable latch circuit 102. One embodiment of the delay circuit 110 is shown in FIG. 2 and uses five inverters 112, 114, 116, 118, 120 to provide signal delays with respective MOSFET shunt loads 122, 124, 126, 128, coupled to the output terminals of the first four inverters, as illustrated in the Figure.

When the XATD output signal is high, the bit lines of the memory device are precharged to a one, as indicated in FIG. 2. When XATD goes low, the word line of the memory goes high so that some of the precharged bit lines are selectively discharged, depending upon the state of the memory bits. When XATD goes low, the charge level of the charged or discharge bit line is then detected and a corresponding signal is sent to the appropriate memory output terminal, that is, the memory content is "evaluated" as being either a one or a zero state, as indicated in FIG. 2.

Each address bit has a latch circuit for providing a corresponding XATD signal. All of the XATD signals are combined in an OR circuit to provide a global, or summarized, XATD signal.

For static operation, no restrictions are placed upon the time that address bits can occur. One address bit can arrive early and another address bit can arrive very late. This is acceptable because the specified access time to retrieve information in a memory starts from the last arriving address bit.

A chip select signal is usually associated with operation of an ATD circuit. When an ATD chip is selected, it is not known whether or not an address bit has been changed before the chip selection. To play it safe, assertion of a chip select signal causes a chip-select-change signal pulse, which is similar to an address-change pulse, to appear at the input node N19 (from a circuit not shown).

FIG. 3 is a timing chart which indicates that a problem arises when a chip select signal is asserted first and then, at a later time, an address bit subsequently changes when the reset signal at node N6 is low. If the address bit changes when N6 is low, that is, has not recovered yet, the signal at node N20 goes low. Because transistor M4 is on instead of off, the signal at output node N20 will go back up as soon as the signal at input node N19 goes low again. A narrow pulse on output node N20 causes a corresponding narrow XATD signal to appear at terminal 106. The corresponding narrow XATD signal is too short to precharge up the selectively discharged bit lines that were discharged by the #1 memory evaluation period (#1 memory evaluate in the Figure) if the #1 memory evaluation period was long enough. The result is that during the #2 memory evaluation period (#2 evaluate) the memory is incorrectly evaluated. This produces a window of non-operation so that the operation of the memory chip does not match that of a purely static operation.

One possible way to correct this situation is to ensure that signal the reset signal at node N6 is not low when a pulse arrives at input node N19. One possible way to provide this is to size the transistors in the delay line 110 so that the positive edge of the signal at node N20 ripples through the delay line quickly and the negative edge of the signal at node N20 goes through the delay line 110 with the required delay time for precharging the bit lines. This narrows the window of non-operation somewhat, but not completely.

A need exists for an improved address transition circuit which can accommodate address bit changes in an ATD circuit.

SUMMARY OF THE INVENTION

It is therefore an object of the invention to provide improved address transition circuit which can accommodate address bit changes in an ATD circuit.

In accordance with these and other objects of the invention, an improved address transition circuit for a memory circuit is provided which includes a resettable latch circuit which provides a modified address transition detection (XATD) signal in response to receiving an address-change input pulse signal at a SET input terminal. A RESET input terminal receives a delayed reset signal from a resettable delay circuit. The address-change pulse signal is generated by combining a memory address bit signal with a delayed memory address bit signal in an Exclusive logic circuit, such as an Exclusive-Or gate.

The resettable delay circuit has its input terminal coupled to the output terminal of the resettable latch circuit for receiving the XATD signal. The output terminal of the resettable latch circuit is coupled to the reset input terminal of the resettable latch circuit. The resettable delay circuit includes a reset control signal terminal to which is coupled an inverted address-change input pulse.

One embodiment of the resettable delay circuit includes a series of inverters and MOSFET capacitive load resistors as well as shunt MOSFET transistors turned on by the address-change signal. The shunt MOSFET transistors are operated by the inverted address-change pulse to shunt the output terminals of the inverters to ground or to VCC to reset the delay line.

To resolve uncertainty about whether or not an address bit has been changed before a chip selection, the SET input terminal also receives a chip-select-change signal pulse which is similar to the address-change pulse. The reset control signal terminal of the resettable delay circuit also has an inverted chip-select-change signal pulse signal coupled thereto.

BRIEF DESCRIPTION OF THE DRAWINGS

The accompanying drawings, which are incorporated in and form a part of this specification, illustrate embodiments of the invention and, together with the description, serve to explain the principles of the invention:

FIG. 1 is a circuit diagram of a prior art address transition circuit which is susceptible to address changes.

FIGS. 2A–2B is a timing chart illustrating normal operation of the prior art address transition circuit of FIG. 1.

FIG. 3A–3B is a timing chart illustrating abnormal operation of the prior art address transition circuit of FIG. 1 caused by a premature N19 input trigger signal.

FIG. 4 is a circuit diagram of an improved address transition circuit according to the invention.

FIGS. 5A–5B is a timing chart illustrating operation of the improved address transition circuit of FIG. 4.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

FIG. 4 is a circuit diagram of an improved address transition circuit 200 according to the invention. The circuit 200 uses some of the same components as shown in FIG. 1. A modified, resettable delay circuit 202 is used as a multi-stage RC delay line. The resettable delay circuit 202 uses the five series inverters 112, 114, 116, 118, 120 with their respective MOSFET capacitive shunt loads 122, 124, 126, 128, coupled to the output terminals of the first four inverters at nodes N2, N3, N4, N5. The circuit of FIG. 4 uses the input signals at node N19, such at the address-change pulse and the chip-select-change signal pulse, to reset the delay line 202 so that the signal at reset node N6 is a one at the same time that the signal at input node N19 is setting XATD to a one level. As a result the input signal at input node N19 is both a set and a reset signal at the same time. This is accomplished by adding an inverter 203 to input node N19 to provide an inverted address-change pulse at an output node N19A thereof and using three shunt transistors in the resettable delay line 202. The shunt transistors include an NMOS transistor 206 added to node N3, a PMOS transistor 208 added to node N4, and a NMOS transistor 210 added to node N5. The gate terminals of these shunt transistors are connected as follows: the gate terminals of transistor 206 and 210 are connected to node N19 and the gate terminal of transistor is connected to node N19A. When the NMOS transistors 206, 210 are turned on by a positive pulse at node N19, nodes N3 and N5 are shunted to ground. When the PMOS transistor 208 is turned on by a low pulse at node N19A, node N4 is shunted, or connected, to a VCC positive voltage. When the shunt transistors are turned on they force the multi-stage RC delay circuit to an initial condition.

FIG. 5 shows the new timing for operation of the circuit of FIG. 4 using the resettable delay line 202. The second precharge interval is now long enough to precharge up the bitlines previously discharged by #1 evaluation. This results in the #2 evaluation being evaluated correctly. Every time that an address changes, everything starts from scratch. If an address changes before a previous address change is evaluated, then the previous evaluation is interrupted and the second address is evaluated instead. The invention produces the same type of operation as that of a static chip.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

I claim:

1. An address transition detection (ATD) circuit for a dynamic memory, comprising:

a resettable latch circuit having an output terminal for providing a modified address transition detection (XATD) signal, a SET input terminal for receiving an address-change input pulse signal, and a RESET input terminal for receiving a delayed reset signal;

a resettable delay circuit having an input terminal coupled to the output terminal of the resettable latch circuit and having an output terminal coupled to the reset input terminal of the resettable latch circuit, wherein the resettable delay circuit includes a reset control signal terminal to which is coupled the address-change input pulse.

2. The address transition detection circuit of claim 1 wherein the SET input terminal also receives a chip-select-change signal pulse and wherein the reset control signal terminal of the resettable delay circuit also has a chip-select-change signal pulse signal coupled thereto.

3. The address transition circuit of claim 1 wherein the address-change pulse signal is generated by combining a memory address bit signal with a delayed memory address bit signal in an Exclusive logic circuit.

4. The address transition circuit of claim 2 wherein the resettable delay circuit includes a series of inverters and MOSFET load resistors as well as shunt MOSFET transistors turned on by the address-change signal, wherein the shunt MOSFET transistors are operated to shunt the output terminals of the inverters and reset the delay circuit.

* * * * *